(12) United States Patent
Schneider

(10) Patent No.: US 11,515,808 B2
(45) Date of Patent: Nov. 29, 2022

(54) ELECTRICAL SYSTEM COMPRISING AT LEAST TWO MODULES

(71) Applicant: Robert Bosch GmbH, Stuttgart (DE)

(72) Inventor: Tobias Schneider, Korntal-Muenchingen (DE)

(73) Assignee: Robert Bosch GmbH, Stuttgart (DE)

(*) Notice: Subject to any disclaimer, the term of this patent is extended or adjusted under 35 U.S.C. 154(b) by 350 days.

(21) Appl. No.: 16/096,793

(22) PCT Filed: Mar. 9, 2017

(86) PCT No.: PCT/EP2017/055506
§ 371 (c)(1),
(2) Date: Jun. 15, 2021

(87) PCT Pub. No.: WO2017/186390
PCT Pub. Date: Nov. 2, 2017

(65) Prior Publication Data
US 2021/0296890 A1    Sep. 23, 2021

(30) Foreign Application Priority Data

Apr. 28, 2016 (DE) .................... 10 2016 207 286.2

(51) Int. Cl.
| | |
|---|---|
| *H02M 7/493* | (2007.01) |
| *B60L 58/20* | (2019.01) |
| *H02J 1/10* | (2006.01) |
| *H02M 3/158* | (2006.01) |
| *H03K 17/12* | (2006.01) |
| *H02M 1/00* | (2006.01) |
| *H02M 7/487* | (2007.01) |

(52) U.S. Cl.
CPC .............. *H02M 7/493* (2013.01); *B60L 58/20* (2019.02); *H02J 1/102* (2013.01);
(Continued)

(58) Field of Classification Search
CPC .... H02M 7/487; H02M 3/155; H02M 1/0095; H02M 3/33584; H02M 3/158;
(Continued)

(56) References Cited

U.S. PATENT DOCUMENTS

| | | | |
|---|---|---|---|
| 2010/0019569 A1* | 1/2010 | Izumi ...................... | B60L 58/20 307/9.1 |
| 2012/0099353 A1* | 4/2012 | Azuma ................... | H02M 7/49 363/71 |

(Continued)

FOREIGN PATENT DOCUMENTS

| | | |
|---|---|---|
| CN | 103283113 A | 9/2013 |
| WO | 2016014901 A1 | 1/2016 |

OTHER PUBLICATIONS

Biela et al., "SiC versus Si—Evaluation of Potentials for Performance Improvement of Inverter and DC-DC Converter Systems by SiC Power Semiconductors", IEEE Transactions on Industrial Electronics, vol. 58, No. 7, Jul. 2011, (pp. 2872-2882).

(Continued)

*Primary Examiner* — Ryan Johnson
(74) *Attorney, Agent, or Firm* — Michael Best & Friedrich LLP

(57) ABSTRACT

Systems and methods relating to an electrical system comprising at least two modules, each module comprising at least one switching element. A first module comprises a first switching element made of a first semiconductor material and the second module comprises a second switching element made of a second semiconductor material.

14 Claims, 5 Drawing Sheets

(52) U.S. Cl.
CPC ......... *H02M 1/0095* (2021.05); *H02M 3/158* (2013.01); *H02M 7/487* (2013.01); *H03K 17/127* (2013.01)

(58) Field of Classification Search
CPC ... H02M 3/1582; H02M 3/1584; B60L 58/20; B60L 2210/10; B60L 2210/12; B60L 2210/14; B60L 2210/40; H02J 1/102; H03K 17/127; H03K 17/567
See application file for complete search history.

(56) References Cited

U.S. PATENT DOCUMENTS

| | | |
|---|---|---|
| 2014/0185346 A1 | 7/2014 | Liu et al. |
| 2017/0185130 A1* | 6/2017 | Zhang ................ H01L 29/1608 |

OTHER PUBLICATIONS

Lai et al., "A Hybrid-Switch-Based Soft-Switching Inverter for Ultrahigh-Efficiency Traction Motor Drives", IEEE Transactions on Industry Applications, vol. 50, No. 3, May/Jun. 2014, (pp. 1966-1973).

Reed et al., "Modleing Power Semiconductor Losses in HEV Powertrains using Si and SiC Devices", Vehicle Power and Propulsion Conference, Sep. 2010, (6 pages).

Sun et al., "A 55-kW Three-Phase Inverter Based on Hybrid-Switch Soft-Switching Modules for High-Temperature Hybrid Electric Vehicle Drive Application", IEEE Transactions on Industry Applications, vol. 48, No. 3, May/Jun. 2012, (pp. 962-969).

\* cited by examiner

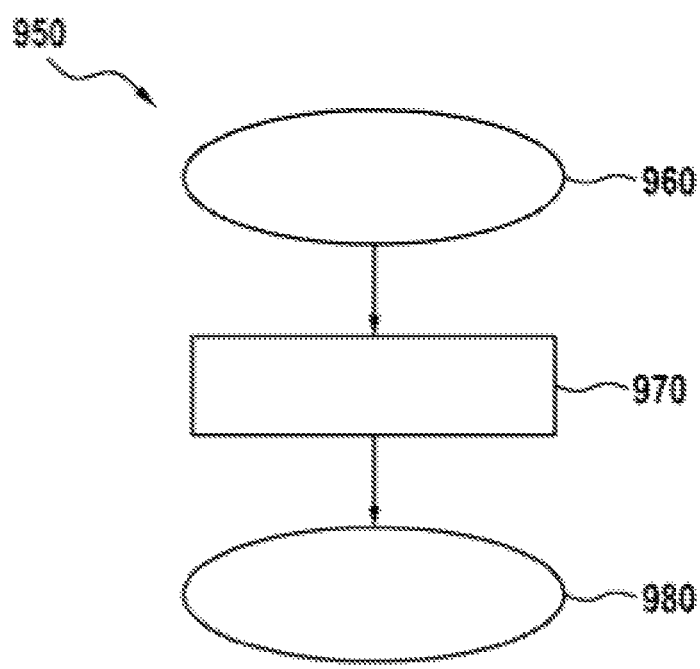

ELECTRICAL SYSTEM COMPRISING AT LEAST TWO MODULES

BACKGROUND OF THE INVENTION

The invention relates to an electrical system comprising at least two modules. In addition, the invention relates to a vehicle comprising the electrical system and to a method for operating the electrical system.

Electrical systems comprising a plurality of modules are known from the prior art. For example, for reasons of scalability of the electrical power, electrical systems comprising a variable number of electrical modules are produced and operated. For example, voltage converters in which, depending on the line current or the line voltage or the energy to be transmitted, a plurality of, in particular identical, rectifier modules or inverter modules are connected in parallel. In the case of these electrical systems comprising at least two modules, there is the need to increase the efficiency of the electrical system, in particular in a cost-effective manner.

SUMMARY OF THE INVENTION

An electrical system comprising at least two modules is provided. In this case, a module of this electrical system comprises at least one switching element. The first module comprises a first switching element consisting of a first semiconductor material. The second module comprises a second switching element consisting of a second semiconductor material.

An electrical system is provided which comprises two modules. In particular, the first and second modules are functionally identical electrical modules, for example a first and a second inverter or a first and a second DC-to-DC voltage converter. The at least two modules each comprise at least one switching element, wherein a first switching element from the first module is manufactured from a first semiconductor material, and a second switching element from the second module is produced from a second semiconductor material. In particular, the electrical or chemical properties of the two semiconductor materials differ from one another. The different electrical properties relate in particular to the electrical conductivity of the material depending on applied electrical fields, electrical voltages and electrical currents. The different chemical properties relate in particular to the different chemical elements from which the materials are composed. Advantageously, an electrical system comprising at least two modules is provided, whereby the modules have different electrical and/or chemical properties.

In another configuration of the invention, the first switching element has greater line and/or switching losses than the second switching element.

Owing to the different semiconductor materials from which the switching elements of the first and second modules are produced, the first switching element has greater line losses or switching losses than the second switching element. Advantageously, modules having different line and/or switching losses are provided.

In another configuration of the invention, during operation of the electrical system, the first switching element is operated at a lower switching frequency than the second switching element.

An electrical system is provided, wherein the first switching element is operated at a lower switching frequency, in particular a switching frequency which is at least 10% lower, than the second switching element. Owing to the different semiconductor materials used and the different electrical properties thereof of the first and second switching elements, there is the possibility of one switching element being operated at a markedly higher frequency than the other without this resulting in any damage to the modules owing to overvoltage or overheating. Advantageously, therefore, an electrical system is provided in which, during operation, the use of the individual modules is optimized depending on the electrical and chemical properties thereof.

In another configuration of the invention, the first semiconductor material has a smaller band gap than the second semiconductor material. In particular, the first semiconductor material is an elemental semiconductor, for example silicon, and in particular the second semiconductor is a compound semiconductor, in particular silicon carbide or gallium nitride.

Different semiconductor materials have different band gaps, with the result that, for example, a semiconductor material having a smaller band gap is used for the first switching element than for the second switching element. Owing to the chemical compositions, the band gaps also differ in the case of different elemental semiconductors or compound semiconductors. When using an elemental semiconductor in one module and a compound semiconductor, in particular silicon carbide or gallium nitride, in another module, even greater band gap differences can result. The greater the differences in the band gaps from one another, the greater the differences in the electrical and chemical properties of the semiconductor materials and therefore also of the individual switching elements and ultimately the modules as well. Advantageously, an electrical system comprising at least two modules is provided, whereby the modules have different electrical and/or chemical properties.

In another configuration of the invention, the electrical powers of the modules are different in magnitude. In particular, they have a ratio of approximately 55 to 45%, 60 to 40%, 70 to 30% or 80 to 20%, or 90 to 10% or vice versa in each case.

The modules of the electrical system have different electrical powers. A single electrical module can be operated in a power range up to a maximum power. Within this power range there is at least one operating point at which the individual module can be operated at its most efficient, for example with respect to the quotient of power loss and useful power. The losses arise, for example, during the switching operations and the conduction of current through the switching element. Useful power is, for example, the electrical power which is transmitted to a consumer which is connected to the switching element. It is desirable to operate this module as close to this efficient operating point as possible. Since the electrical system comprises at least two modules of different powers, at least two different operating points at which in each case one of the two modules is operated at its most efficient result. A third efficient operating point results from the joint operation of the two modules at their respective most efficient operating point. Advantageously, an electrical system is provided which, owing to the connectability and disconnectability of the individual modules and the rated powers of different magnitudes thereof, can be operated very efficiently close to at least one of the three most efficient operating points, depending on a power requirement.

In another configuration of the invention, the first module is designed to supply electrical energy to at least one first independent electrical component, and the second module is designed to supply electrical energy to at least one second independent electrical component. The first module is in particular designed to supply power to at least one first electrical machine, and the second module is designed in particular to supply power to a second electrical machine.

Provision is made for the first module to be designed to supply power to a first independent electrical component, in particular a first electrical machine. Provision is further made for the second module to be designed to supply power to at least one second electrical component, in particular a second electrical machine. Advantageously, an electrical system for supplying power to two independent electrical components is provided.

In another configuration of the invention, the electrical system is an electrical drive system. The two modules are two drive modules. A first drive module comprises at least one first inverter having the first switching element, and a second drive module comprises at least one second inverter having the second switching element.

An electrical drive system comprising two drive modules is provided. A first drive module comprises a first inverter, which comprises at least the first switching element. A second drive module comprises a second inverter, which comprises at least the second switching element. Therefore, a drive system is provided which comprises two inverters, wherein the first inverter comprises the first switching element consisting of the first semiconductor material, and the second inverter comprises the second switching element consisting of the second semiconductor material. The two inverters are designed in particular for jointly supplying power to an electrical component or for each supplying power to an independent electrical component. The electrical component may be an electrical machine. Said electrical machine may be supplied power jointly, for example by virtue of the inverters being connected in parallel. Alternatively, the inverters each supply power to an independent electrical machine. Advantageously, a drive system is provided whose inverters have different electrical or chemical properties.

In another configuration of the invention, the first drive module is designed to supply power to a first electrical machine for driving a vehicle, and the second drive module is designed to supply power to a second electrical machine for driving the vehicle.

An electrical system for electrically driving a vehicle is provided. A first drive module is provided for supplying power to a first electrical machine for driving the vehicle. A second drive module is provided for supplying power to a second electrical machine for driving the vehicle. In this configuration of the invention, a vehicle has a first and a second electrical machine, which can be operated either individually or jointly for driving the vehicle. For this purpose, a plurality of vehicle topologies is conceivable. For example, a vehicle in which in each case one electrical machine is fitted to different drive axles for driving the axle. Or a parallel hybrid in which, in addition, an internal combustion engine can output a torque to at least one of the drive axles. Or a torque split drive in which at least one of the two axles can be driven by two drive assemblies via a planetary gear. Advantageously, an electrical drive system is provided which can be operated in a more failsafe and efficient manner owing to the greater number of drive machines. More efficient operation is possible in particular when the different electrical machines have rated powers of different magnitudes. Advantageously, the electrical system can thus be operated particularly efficiently close to one of the three resulting optimum operating points.

In another configuration of the invention, the electrical system is an electrical converter system. The two modules are two voltage converter modules, wherein a first voltage converter module comprises at least one first DC-to-DC voltage converter having the first switching element, and a second voltage converter module comprises at least one second DC-to-DC voltage converter having the second switching element.

Therefore, a converter system is provided which comprises at least two voltage converter modules. A first DC-to-DC voltage converter comprises the first switching element, and a second DC-to-DC voltage converter comprises the second switching element. The two DC-to-DC voltage converters are designed in particular for jointly supplying power to an electrical component or for each supplying power to an independent electrical component. The electrical component may be, for example, an electrical power supply system or subsystem or a DC voltage consumer. Such a power supply system or a consumer can be supplied power jointly, for example by means of the DC-to-DC voltage converters being connected in parallel or in series. Alternatively, the DC-to-DC voltage converters each supply power to an independent electrical consumer or electrical power supply system. Advantageously, an electrical converter system is provided which, as described above, can be operated particularly efficiently.

In another configuration of the invention, provision is made for the first and second voltage converter modules to be designed to convert electrical energy from at least one energy source for supplying power to an electrical power supply system or subsystem, in particular a traction power supply system or an on-board power supply system of a vehicle.

An electrical converter system is provided which is designed to convert the energy from at least one energy source. An energy source is, for example, a battery, a fuel cell, a power supply system or another type of energy module. The voltage converter modules convert the energy from this energy source for supplying power to an electrical power supply system or subsystem. The electrical power supply system or subsystem is in particular a traction power supply system or high-voltage power supply system of a vehicle or an on-board power supply system of a vehicle. Such an on-board power supply system is conventionally operated in the low-voltage range at 12 volts or 48 volts, in particular below 48 V. Advantageously, by splitting the conversion between two voltage converter modules, the possibility is provided of operating the electrical converter system particularly efficiently in the region of three operating points.

In addition, the invention comprises a vehicle having a described electrical system. Advantageously, therefore, a vehicle having an electrical system is provided which can be operated efficiently.

In addition, the invention relates to a method for operating an electrical system comprising at least two modules, wherein one module comprises at least one switching element. The first module comprises a first switching element consisting of a first semiconductor material, and the second module comprises a second switching element consisting of a second semiconductor material. During operation of the electrical system, the first module is operated using a first mode of operation and the second module is operated using a second mode of operation.

Owing to the different semiconductor materials used and the different electrical properties thereof of the first and second switching elements, there is the possibility of operating one switching element using a different mode of operation than the other without this resulting in any damage to the modules or switching elements owing to overvoltage or overheating. Mode of operation is understood to mean, for example, different actuation methods, signal paths, types of modulation or switching frequencies. Advantageously, therefore, a method for operating an electrical system is provided in which the individual modules are operated in optimized fashion depending on the electrical and chemical properties thereof.

In another configuration of the invention, during operation of the electrical system, the first module is operated at a lower switching frequency than the second module.

Owing to the different semiconductor materials used and the different electrical properties thereof of the first and second switching elements, there is the possibility of one switching element being operated at a markedly higher switching frequency than the other without this resulting in any damage to the modules or switching elements owing to overvoltage or overheating. This means that a substantially lower switching frequency is preset for the operation of the first module than for the operation of the second module. In particular, a switching frequency is preset for the operation of the first module which is at least 10% lower than the switching frequency which is preset for the operation of the second module. Advantageously, therefore, a method for operating an electrical system is provided in which the individual modules are operated in optimized fashion depending on the electrical and chemical properties thereof.

In another configuration of the invention, during operation of the electrical system, the first module is operated using a first actuation method, in particular pulse-width-modulated, and the second module is operated using a second actuation method, in particular in block mode.

Owing to the different semiconductor materials used and the different electrical properties thereof of the first and second switching elements, there is the possibility of one switching element being operated using a first actuation method and the second switching element being operated using a second actuation method without this resulting in any damage to the switching elements or modules owing to different loads, i.e. overvoltage or overheating. Depending on the application, for example, pulse width modulation (PWM), space vector pulse width modulation (SVPWM) or the block mode can be used as the different actuation methods. Advantageously, therefore, a method for operating an electrical system is provided in which the individual modules are operated in optimized fashion depending on the electrical and chemical properties thereof.

In addition, the invention relates to a computer program, which is designed to implement the above-described method.

In addition, the invention comprises a machine-readable storage medium, on which the described computer program is stored.

It goes without saying that the features, properties and advantages of the system according to the invention relate or are applicable to the exemplary embodiments, and vice versa.

Further features and advantages of embodiments of the invention are given in the description below with reference to the attached drawings.

BRIEF DESCRIPTION OF THE DRAWINGS

The invention will be explained in more detail below with reference to some figures, in which:

FIG. 8 shows a schematic flowchart of a method for operating the electrical system.

DETAILED DESCRIPTION

Figure 1:
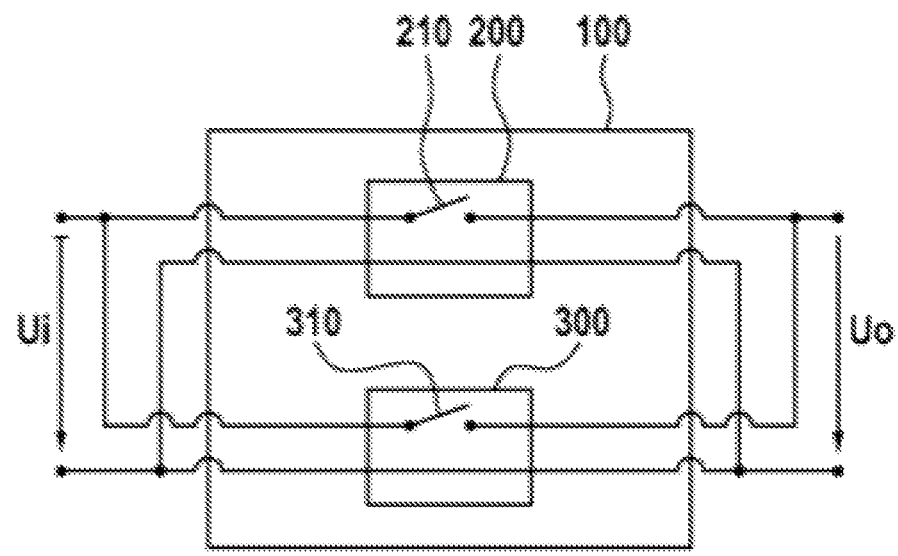
FIG. 1 shows a schematically illustrated electrical system comprising at least two modules.

FIG. 1 shows a schematic illustration of an electrical system 100 comprising at least two modules 200, 300. The first module 200 comprises at least one first switching element 210 consisting of a first semiconductor material. The second module 300 comprises at least one second switching element 310 consisting of a second semiconductor material. Wiring of the electrical system is illustrated by way of example such that an input voltage Ui can be tapped off on the input side, and an output voltage Uo can be tapped off on the output side. By virtue of the circuit illustrated by way of example and in simplified form, there is the possibility of transmitting an electrical power from the input side of the electrical system to the output side of the electrical system by closing of the at least one switching element of one of the two modules. Owing to the fact that the first switching element 210 consists of a different semiconductor material than the second switching element 310, the losses, in particular switching losses and line losses, which occur during power transmission are different. Owing to the different characteristics of the first and second switching elements, particularly advantageously the first switching element 210 is operated at a different switching frequency than the second switching element 310. This may be particularly advantageous for high efficiency of the overall system in partial load operating states, which represent a substantial and range-relevant operating state, in particular in the case of vehicle drives. By way of example, semiconductor materials having different band gaps are used as different semiconductor materials. For this purpose, for example, an elemental semiconductor consisting of silicon is used for the first switching element 210, and a compound semiconductor consisting of silicon carbide or gallium nitride is used for the second switching element 310. Owing to the losses of different magnitudes of the first and second switching elements 210, 310 or modules 200, 300, advantageously modules with different magnitudes of electrical power are provided in particular in an electrical system 100. For the operation of a system with a relatively low permanently required base load and short-term peak load, in particular a first module 200 having a relatively low performance and low losses is used with a further module 300 having a high electrical power and high electrical losses. Overall, this results in a more cost-effective system. The production costs for the module having the relatively low losses are acceptable owing to the design for low electrical power. For continuous operation, favorable operating costs are associated with this. For the peak load which is required in the short term, a second module having favorable conventional technology is provided which, however, causes relatively high losses at relatively low cost.

Figure 2:
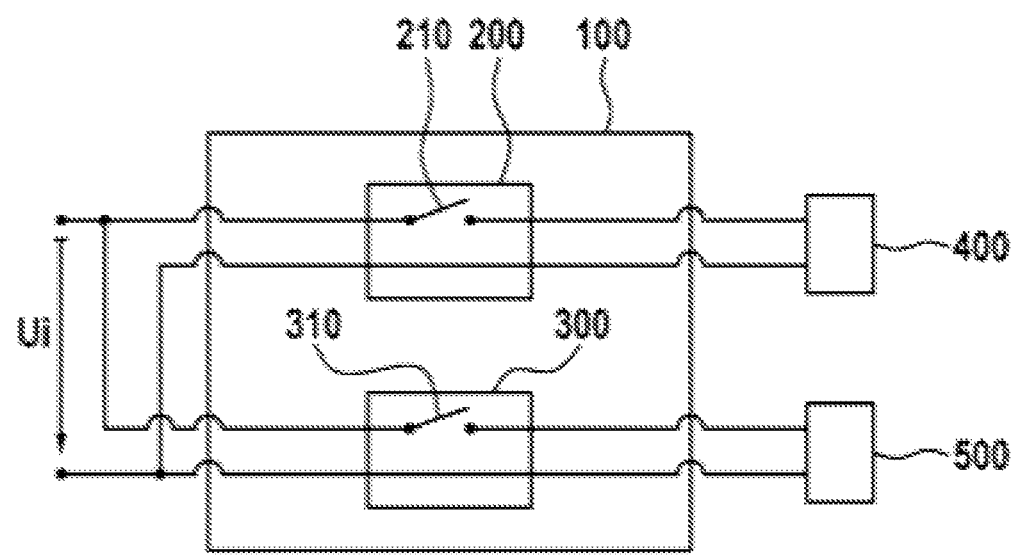
FIG. 2 shows a schematically illustrated electrical system for supplying power to a first and a second independent component.

FIG. 2 likewise shows a schematic illustration of an electrical system 100 comprising a first module 200 and a second module 300. The first module 200 is provided for supplying power to at least one first independent electrical component 400, and the second module 300 is provided for supplying power to at least one second independent electrical component 500. This embodiment is intended in particular for operating two electrical components 400, 500, of which likewise in turn one is designed for continuous operation, and the other is designed for comparatively short-term operation. In this case too, the considerations again apply whereby the component designed for continuous operation is operated with as low losses as possible and in particular with relatively low power, and the more rarely used, more favorable component is operable with relatively high losses and in particular with relatively high power. In addition, the first switching element 210 consisting of a first semiconductor material is correspondingly again used in the first module 200, and the second switching element 310 consisting of a second semiconductor material is produced in the second module 300.

Figure 3:
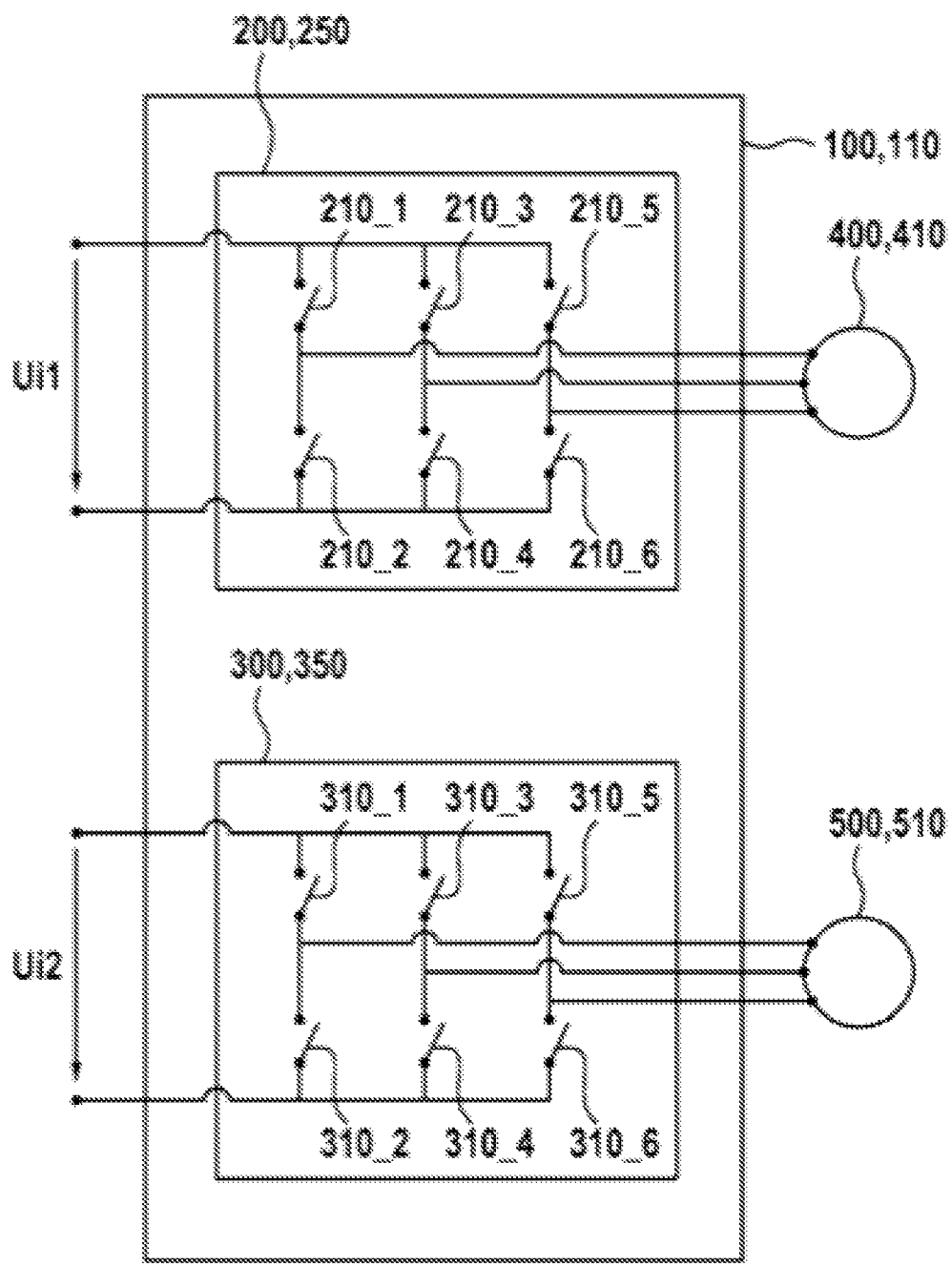
FIG. 3 shows an electrical drive system comprising two inverters.

FIG. 3 shows an electrical system 100 implemented as an electrical drive system 110. In addition, the system 100 comprises a first module 200 and a second module 300, which, as a first drive module 250, is equipped with a first inverter and, as a second drive module 350, is equipped with a second inverter. The first inverter comprises at least the first switching element 210, wherein, in the drawing, a three-phase inverter having two half-bridges comprises the switching elements 210_1 . . . , 210_6. These first switching elements are in turn manufactured from a first semiconductor material. The second inverter correspondingly comprises switching elements 310_1 . . . , 310_6. The first inverter of the first drive module 205 supplies power to a first electrical component 400, which in this exemplary embodiment is in the form of a first electrical machine 410. Correspondingly, the second drive module 350 supplies power to a second electrical component 500, which in this exemplary embodiment is in the form of an electrical machine 510. Similarly to the previous exemplary embodiments, it lends itself to design the drive module differently depending on the power requirement and the period of use and to select switching elements correspondingly for this purpose which are produced from different semiconductor materials and have correspondingly different losses during switching and during operation. The same also applies to the electrical machines. Thus, for example, the electrical machines can be designed differently depending on the power requirement and the period of use and machine types (for example synchronous or asynchronous machines, electrically excited machines or permanent magnet machines), designs or materials can be selected correspondingly for this purpose which have correspondingly different losses during operation. FIG. 3 illustrates, by way of example, a first input voltage Ui1 and a second input voltage Ui2 as input voltage. A parallel supply of a common input voltage Ui (not illustrated for reasons of clarity) to the two inverters is likewise possible.

Such a double inverter can be installed in a common housing. Advantageously, a possibly jointly used input filter and intermediate circuit capacitor as well as the microcontroller having two output stages which can be matched in terms of their power distribution to the respective application can also be integrated therein. In this case, one of the two inverters, for example, uses highly efficient SiC technology, whereas the power section provided for the boost drive operates using conventional Si-IGBT technology. In addition to the connection to the vehicle battery and the vehicle control device, the double inverter can have two connections for electrical machines. Depending on the degree of integration between the inverter and the machine or machines, the double inverter can also be integrated in the housing of the electrical machine. Advantageously, the complexity involved in the wiring of the components is reduced with greater integration.

Figure 4:
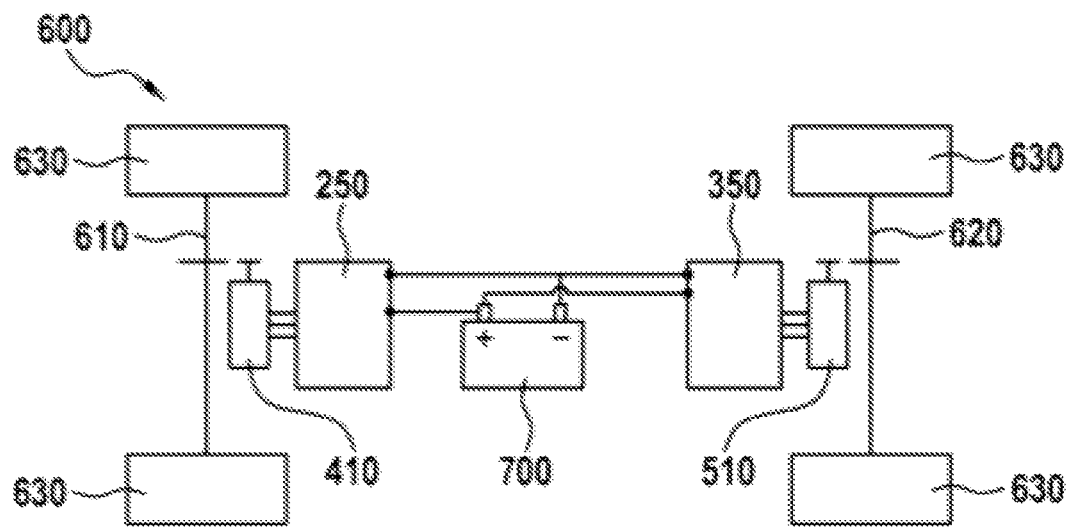
FIG. 4 shows an electrical system comprising two drive modules for driving a vehicle.

FIG. 4 shows a vehicle 600 comprising a first drive axle 610 and drive wheel tires 630 connected thereto as well as a second drive axle 620 having drive wheels 630 likewise connected thereto. An electrical system or drive system (not identified in the drawing) comprises the two drive modules 250 and 350, which are supplied power from a common energy source, for example a high-voltage battery 700. Alternatively, two energy sources Ui1, Ui2, as illustrated in FIG. 3, can also be provided for supplying power to the drive modules 250 and 350. The first drive module 250 supplies electrical energy to a first electrical machine 410 for driving the first drive axle 610 of the vehicle. The second drive module 350 supplies power to a second electrical machine 510, which in turn drives the second drive axle 620 of the vehicle. Alternatively, there is the possibility of providing an electrical system 100 in a vehicle 600, as illustrated in FIG. 1, wherein the electrical system 100 comprises two modules 200, 300, for example two drive modules 250 and 350, which are connected in parallel on the output side for supplying power to an individual electrical machine.

Therefore, cycle-relevant partial load operating states (for example less than 20% of the peak power installed for the vehicle acceleration or vehicle gradeability in the vehicle) of a system constructed merely by means of one module and having the low efficiencies associated therewith are avoided or significantly reduced. Low loads are covered by the electrical system 100 comprising two modules 200, 300 by means of an efficiency-optimized module 200, 300 which is dimensioned specifically for this purpose. As a result, the efficiency of the entire drive system is increased. The peak power required for acceleration and gradeability is provided by means of the operation of the two modules 200, 300.

Figure 5:
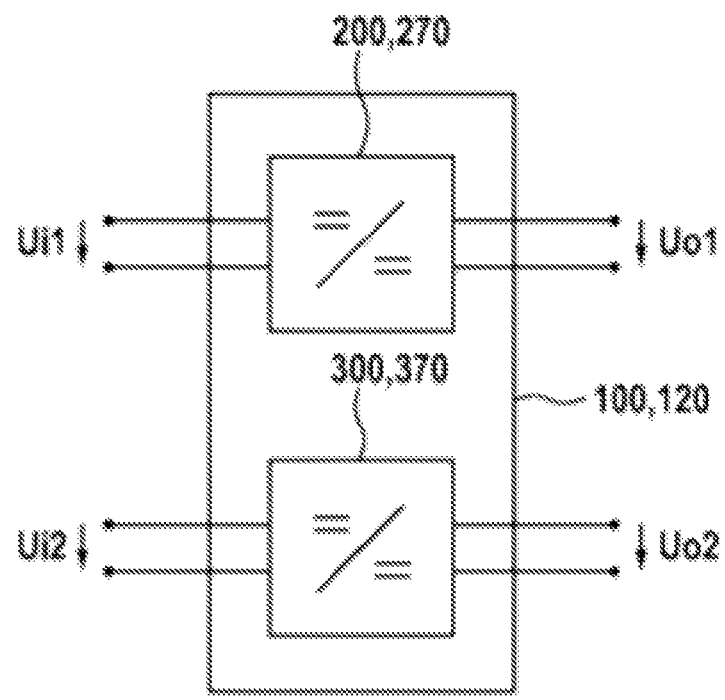
FIG. 5 shows an electrical converter system comprising two voltage converter modules.

FIG. 5 shows, illustrated schematically, an electrical system 100 in the form of an electrical converter system 120. The electrical converter system comprises a first module 200, which is in the form of a voltage converter module 270. The second module 300 is in the form of a second voltage converter module 370. In turn, the first voltage converter module 270 comprises a first switching element 210 consisting of a first semiconductor material, and the second voltage converter module comprises a second switching element consisting of a second semiconductor material. The voltage converter modules 270 and 370 are in the form of DC-to-DC voltage converters for converting a first input voltage Ui1, via the first voltage converter 270, into a first output voltage Uo1. A second input voltage Ui2 is converted into a second output voltage Uo2 by means of the second voltage converter 370. In this exemplary embodiment too, it is possible to replace the input voltages Ui1 and Ui2 with a common input voltage Ui and to connect the voltage converters in parallel with one another on the input side. The same applies to the output voltages Uo1 and Uo2 of the voltage converters 270, 370. Owing to the different semiconductor materials of the first and second switching elements of the first and second modules 200, 300, different losses result during the transmission of energy by means of the first voltage converter module 270 or the second voltage converter module 370.

Figure 6:
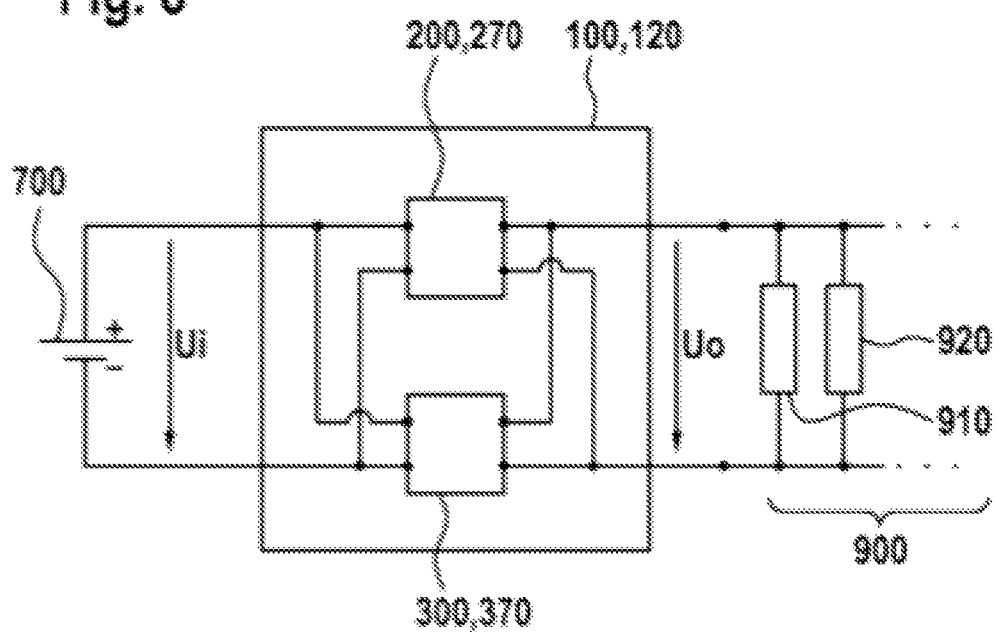
FIG. 6 shows an electrical converter system for supplying power to an on-board power supply system, for example of a vehicle.

FIG. 6 shows an electrical system 100, which, as in FIG. 5, is in the form of an electrical converter system comprising two voltage converter modules 270 and 370. In this exemplary embodiment, an input voltage Ui from a battery 700 is converted into an output voltage Uo by means of the electrical converter system, said output voltage Uo being provided for supplying power to an electrical power supply system, in particular an on-board power supply system 900, of a vehicle having a multiplicity of consumers 910, 920. Both the input voltage Ui and the output voltage Uo of the individual voltage converter modules 270, 370 are connected in parallel in this exemplary embodiment. Therefore, energy transmission from the input side of the electrical system can take place both via an individual voltage converter module 270, 370 and, if required, also by means of the two voltage converter modules 270, 370.

Figure 7:
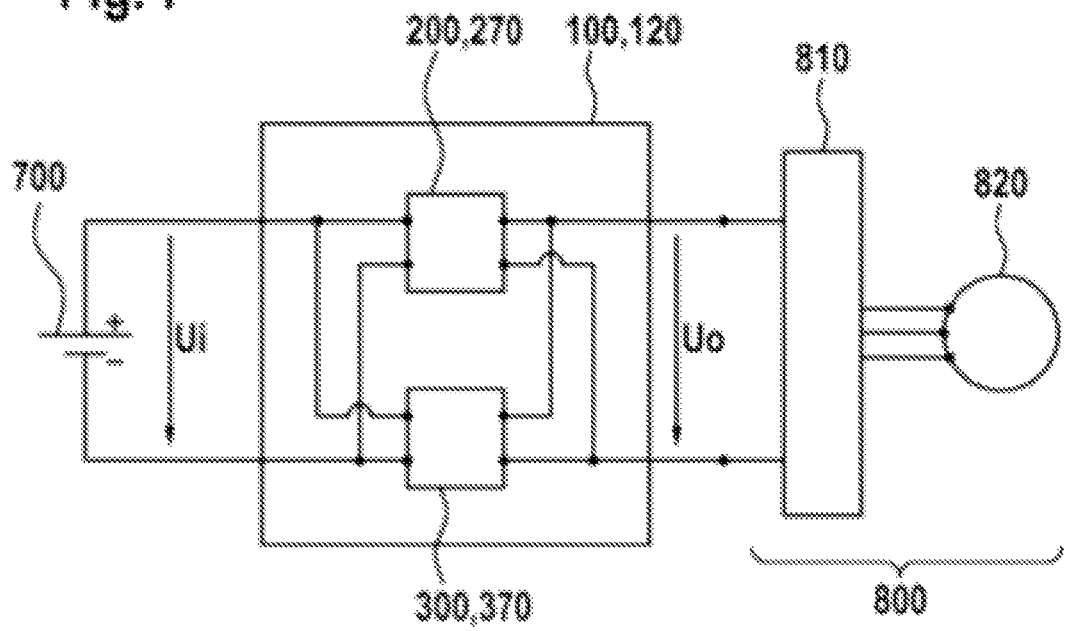
FIG. 7 shows an electrical converter system for supplying power to a traction power supply system, for example of a vehicle.

FIG. 7 likewise shows an electrical system 100, which is likewise in the form of an electrical converter system 120. In this exemplary embodiment, the electrical converter system supplies power to an electrical power supply system 800. The electrical power supply system 800 is a traction power supply system for driving a vehicle, wherein the output voltage Uo acts as input voltage of an inverter 810, which supplies a polyphase AC voltage to an electrical drive machine 820. In particular, this inverter 810 can advantageously be constructed as an electrical system 100 comprising a first module 200 and a second module 300, or a first inverter 250 connected in parallel and a second inverter 350, for jointly supplying power to the electrical machine 820.

FIG. 8 shows a flowchart 950 of a method for operating an electrical system 100 comprising at least two modules 200, 300. The method starts with step 960. In step 970, the electrical system 100 is operated, wherein the first module 200 is operated using a first mode of operation and the second module 300 is operated using a second mode of operation. For example, the switching frequencies at which the modules 200, 300 are actuated can differ significantly, for example 2 kHz to 10 kHz and 50 kHz, or, depending on use, for example in the case of DC-to-DC voltage converters, 10 kHz and 300 kHz. Alternatively or in addition, different types of modulation can be used for actuating the modules 200, 300. The method ends with step 980.

The invention claimed is:

1. An electrical system (100) comprising at least two modules (200, 300), wherein one module (200, 300) comprises at least one switching element (210, 310), wherein a first module (200) of the at least two modules (200, 300) comprises a first switching element (210) consisting of a first semiconductor material, and a second module (300) of the at least two modules (200, 300) comprises a second switching element (310) consisting of a second semiconductor material,
    wherein only the first module (200) is configured to supply electrical energy to at least one first independent electrical component (400), and only the second module (300) is configured to supply electrical energy to at least one second independent electrical component (500).

2. The electrical system (100) as claimed in claim 1, wherein the first switching element (210) has greater line and/or switching losses than the second switching element (310).

3. The electrical system (100) as claimed in claim 1, wherein, during operation of the electrical system, the first switching element (210) is operated at a lower switching frequency than the second switching element (310).

4. The electrical system (100) as claimed in claim 1, wherein the first semiconductor material has a smaller band gap than the second semiconductor material, wherein the first semiconductor material is an elemental semiconductor or silicon, and the second semiconductor material is a compound semiconductor or silicon carbide.

5. The electrical system (100) as claimed in claim 1, wherein the electrical powers of the modules (200, 300) are different in magnitude.

6. The electrical system (100) as claimed in claim 1, wherein the electrical system (100) is an electrical drive system (110), and the two modules (200, 300) are two drive modules (250, 350), wherein a first drive module (250) comprises at least one first inverter having the first switching element (210-$x$), and a second drive module (350) comprises at least one second inverter having the second switching element (310_$x$).

7. The electrical system (100) as claimed in claim 6, wherein the first drive module (250) is configured to supply power to a first electrical machine (410) for driving a vehicle (600), and the second drive module (350) is configured to supply power to a second electrical machine (510) for driving the vehicle (600).

8. The electrical system (100) as claimed in claim 1, wherein the electrical system (100) is an electrical converter system (120), and the two modules (200, 300) are two voltage converter modules (270, 370), wherein a first voltage converter module (270) comprises at least one first DC-to-DC voltage converter having the first switching element (210), and a second voltage converter module (370) comprises at least one second DC-to-DC voltage converter having the second switching element (310).

9. The electrical system (100) as claimed in claim 8, wherein the first and second voltage converter modules (270, 370) are configured to convert electrical energy from at least one energy source (700) for supplying power to an electrical power supply system (800, 900) or subsystem.

10. A vehicle (600) comprising an electrical system (100), the electrical system (100) including:
    at least two modules (200, 300), wherein one module (200, 300) comprises at least one switching element (210, 310), wherein a first module (200) of the at least two modules (200, 300) comprises a first switching element (210) consisting of a first semiconductor material, and a second module (300) of the at least two modules (200, 300) comprises a second switching element (310) consisting of a second semiconductor material,
    wherein only the first module (200) is configured to supply electrical energy to at least one first independent electrical component (400), and only the second module (300) is configured to supply electrical energy to at least one second independent electrical component (500).

11. A method (950) for operating an electrical system (100) comprising at least two modules (200, 300), wherein one module (200, 300) comprises at least one switching element (210, 310), wherein a first module (200) of the at least two modules (200, 300) comprises a first switching element (210) consisting of a first semiconductor material, and a second module (300) comprises a second switching element (310) consisting of a second semiconductor material, and, during operation (920) of the electrical system (100), the first module (200) is operated using a first mode of operation and the second module (300) is operated using a second mode of operation,
  wherein only the first module (200) is configured to supply electrical energy to at least one first independent electrical component (400), and only the second module (300) is configured to supply electrical energy to at least one second independent electrical component (500).

12. The method (950) for operating an electrical system (100) as claimed in claim 11, wherein, during operation (920) of the electrical system (100), the first module (200) is operated at a lower switching frequency than the second module (300).

13. The method (950) for operating an electrical system (100) as claimed in claim 11, wherein, during operation (970) of the electrical system (100), the first module (200) is operated using a first actuation method and the second module (300) is operated using a second actuation method.

14. A non-transitory, computer-readable storage medium containing instruction that when executed by a computer cause the computer to control an electrical system (100) having at least two modules (200, 300), wherein a first module (200) of the at least two modules (200, 300) comprises a first switching element (210) consisting of a first semiconductor material, and a second module (300) of the at least two modules (200, 300) comprises a second switching element (310) consisting of a second semiconductor material, to
  operate the first module (200) in a first mode of operation, and
  operate the second module (300) in a second mode of operation,
  wherein only the first module (200) is configured to supply electrical energy to at least one first independent electrical component (400), and only the second module (300) is configured to supply electrical energy to at least one second independent electrical component (500).

* * * * *